United States Patent [19]
Booth et al.

[11] Patent Number: 5,041,163
[45] Date of Patent: Aug. 20, 1991

[54] FLUSHED PIGMENT AND A METHOD FOR MAKING THE SAME

[75] Inventors: John S. Booth, Fall River; Edward W. Makuch, N. Wesport, both of Mass.

[73] Assignee: Roma Color, Inc., Fall River, Mass.

[21] Appl. No.: 362,979

[22] Filed: Jun. 8, 1989

Related U.S. Application Data

[63] Continuation-in-part of Ser. No. 205,306, Jun. 10, 1988, abandoned.

[51] Int. Cl.$^5$ ............................................. C08K 5/00
[52] U.S. Cl. .................................... 106/493; 106/410; 106/497; 106/500; 106/504
[58] Field of Search ............... 106/410, 493, 497, 500, 106/504

[56] References Cited

U.S. PATENT DOCUMENTS

| | | | |
|---|---|---|---|
| 3,844,811 | 10/1974 | Brynko | 106/493 |
| 3,980,488 | 9/1976 | Barrington et al. | 106/497 |
| 4,194,921 | 3/1980 | Wheeler et al. | 106/493 |
| 4,309,223 | 1/1982 | Rouwhorst et al. | 106/493 |
| 4,747,882 | 5/1988 | Schwartz et al. | 106/500 |
| 4,765,841 | 8/1988 | Vinther et al. | 106/493 |

Primary Examiner—Paul Lieberman
Assistant Examiner—Willie J. Thompson
Attorney, Agent, or Firm—Samuels, Gauthier & Stevens

[57] ABSTRACT

A pigment is formed in an aqueous slurry. A mixture of the pigmented slurry and a vehicle is subjected to high speed, high shear mixing action. The water is forced out of the solid pigment and replaced by the vehicle forming bead-like spherical conglomerates. The conglomerates grow into clusters in the dispersing phase during the mixing process. The clusters are filtered from the dispersing water phase forming a flushed pigment which is used for dispersion in ink systems.

29 Claims, 3 Drawing Sheets 0 2 4 mm

FLUSHED PIGMENT AND A METHOD FOR MAKING THE SAME

This is a continuation-in-part of copending U.S. application Ser. No. 205,306 filed on June 10, 1988.

BACKGROUND OF THE INVENTION

Historically, organic pigments have been made by coupling in a dilute aqueous slurry. The slurry is then filtered in a filter press to concentrate the pigment and to form a press cake. The press cake is either dried to obtain a dry pigment, or "flushed" to transfer the pigment particles from the aqueous phase to a non-polar oil or resin phase commonly referred to as a "flushed color". In the resulting flushed color state, the pigment particles are kept in a paste-like state for ultimate use in inks or coatings.

Flushing has been carried out for many decades by mixing pigment press cake with suitable types and quantities of "vehicles" which may for example comprise an oil, or a solution of one or more resins and other additives in a solvent Typically, in the prior art, the transfer is effected by vigorously kneading the press cake and vehicle until the flushing is complete. These are generally batch type operations employing sigma-blade mixers similar to dough mixers or Banbury mixers.

Other prior art techniques also exist. For example, in U.S. Pat. No. 4,309,223, the pigment slurry if forced through a conduit with vehicle injection. U.S. Pat. No. 3,980,488 teaches partially milling dry pigment prior to flushing. U.S. Pat. No. 2,378,786 teaches mixing a pigment slurry with oil, passing the mixture through a colloid mill, which could be considered equivalent to a homogenizer, followed by passing through a heat exchanger and de-watering on a heated belt. U.S. Pat. No. 4,747,882 teaches mixing a pigment slurry with an oil to transfer the pigment from the aqueous phase to the oil.

These processes are very energy and labor intensive. Moreover, the resulting product or dispersion is often an extremely viscous paste which must be laboriously removed by manually shoveling or scraping. Flushed colors may have up to 30%-35% by weight pigment, 64.9%-69.9% by weight vehicle, and the remainder water. Most of the water in normal flushed color is removed by heat and/or vacuum.

Those skilled in the art will readily recognize that transparency is a highly desirable property of flushed colors. During the vigorous kneading step of conventional flushing processes, considerable heat is generated. Heat does not adversely affect the transparent properties of red and blue pigments. However, yellow pigments, particularly AAA yellows, are extremely heat sensitive and can turn from transparent to opaque as a result of being subjected to excessive heat. In order to prevent or at least minimize this problem, the prior art processes employ complex and expensive cooling techniques. Such techniques are not required in the process of the present invention because little, if any, heat is generated.

It will be seen, therefore, that the prior art flushed colors are made by processes which are labor and energy intensive, and in the cases where yellow pigment is being produced, such processes are further complicated by the need for complex and expensive cooling techniques. Once made, the conventional flushed colors are difficult to process further because of their extremely high viscosities.

SUMMARY OF THE INVENTION

The present invention is directed to an improved flushed pigment and to a novel and improved process for making the same. The process of the present invention may be run at ambient temperatures and requires only relatively low expenditures of energy and labor as compared to prior art processes. This is particularly advantageous in the case of heat sensitive yellow pigments. The flushed pigment of the present invention is easily handled both before and during the ink manufacturing process.

Broadly, the invention, in one aspect, includes flushing a pigment formed in an aqueous slurry in a manner such that the vehicle displaces the water in and surrounding the pigment to form spherical pigment/vehicle conglomerates which grow into clusters in a dispersing water phase. The pigment/vehicle clusters are recovered from the dispersing water phase as a flushed pigment. The clusters have physical properties which are markedly different and significantly advantageous as compared to the flushed product of the prior art. For example, the pigment/vehicle agglomerated clusters are easily separated and recovered from the dispersing water phase. They also possess a markedly superior rate of dispersion into ink systems.

In the preferred embodiment of the present invention, a mixture of pigmented slurry and vehicle is subjected to intense high speed, high shear mixing action. This action commences flushing of the water from the pigment, whereby the water is forced out of the solid pigment and replaced by the vehicle (the pigment is lyophilic with the vehicle), forming bead-like spherical conglomerates. These conglomerates exhibit a tendency to grow into clusters in the dispersing phase during the mixing process. After the flushing has been completed, the mixture in the tank exists in two phases, namely, the pigment/vehicle agglomerated cluster phase and the dispersing water phase.

The mixture is then filtered, preferably by being transferred into a webbed, nylon bag. The free water passes through the bag as filtrate. The bag retains the pigment/vehicle clusters as a flushed cake made up of the flushed pigment. The flushed cake is washed with water to remove the remaining soluble salts. The flushed pigment is then ready for use "as is" for dispersion in ink systems. Alternatively, the mixing can be stopped and the pigment/vehicle agglomerated clusters allowed to simply float to the top of the tank. Therefore, the dispersing salt water is displaced by fresh water by normal decanting and washing processes.

The invention in another aspect is particularly suited for resinated pigments. After the coupling reaction has been effected in the strike tank, the pH is raised to between 10.0 to 11.5. The pigment is then flushed according to the method of the invention at this elevated pH. After flushing, the pH is lowered to about 6.5–7.0. Flushed pigment produced by this technique has superior dispersibility in the subsequent systems in which it is used, has a higher pigment to vehicle loading ratio and when being formulated in another system for end use, such as an ink system, the thixotropic properties usually incurred are far less.

The invention in still another aspect comprises the resulting flushed pigment. The pigment/vehicle clusters assume various forms, including for example, discrete shapes which can be bead-like or rod-like.

The flushed pigment of the present invention as flushed cake has between 5% to 50% water, usually 5% to 25% water, the remainder being solids, preferably less water by weight than pigment content. The solids comprise the pigment/vehicle clusters.

Retained (or bound) water may be removed easily by processing the flushed cake in a Banbury mixer. Generally, all flushed pigments produced according to the invention can have the water content easily reduced to 5% to 10%. In this step the flushed cake changes to a paste-like consistency (similar to molasses). However the dispersion properties are not affected. The pigment/vehicle ratio may vary between about 7:1::1:7, preferably 1:1 by weight.

The flushed pigment of the present invention, when formulated into an ink system, disperses remarkably easily as compared to conventional flushed colors, especially at comparable pigment concentrations.

DESCRIPTION OF THE PREFERRED EMBODIMENT

An aqueous slurry of less than 10% and preferably between 5% to 7% solids of solid organic pigment is thoroughly mixed with an organic vehicle in a manner such that the organic vehicle is transferred to the solid pigment, thereby replacing the water in and surrounding the pigment to form pigment/vehicle conglomerates suspended in water. These conglomerates grow into clusters which are subsequently separated from the dispersing phase.

Although the preferred embodiment will be described with reference to slurries of diarylide yellow pigments, such as CI pigment yellow 12, the invention is also applicable to other organic pigments, resinated or non-resinated, such as CI pigment yellows 13, 14, 17, 83; CI pigment orange 15, 16, 34; and CI pigment reds 17, 23, 48, 49, 53, and 57. In addition to phthalocyanine blue magmas, the process is applicable to other pigments manufactured by the salt grinding process such as quinacridones, dioxazines, perylenes, indanthrones, and vat pigments.

Any of the hydrophobic organic vehicles that are commonly used in printing inks and coating compositions may be employed in the method and composition of this invention. Such vehicles are represented by drying, semi-drying, and non-drying oils, litho varnishes, mineral oils, rosins, dimerized rosins, esters of dimerized rosins, aliphatic and aromatic hydrocarbon resins, alkyl-aromatic resins, maleic and fumeric-modified rosin, phenolic resin, phenolicmodified rosin esters, alkyd resins, urethane-modified alkyds, polyolefins, coumarone resins, phthalate esters, castor oil, fish oil, linseed oil, gloss varnishes and various heat-set, quick-set and steam-set vehicle systems. A preferred vehicle is soy bean oil.

Figure 1:
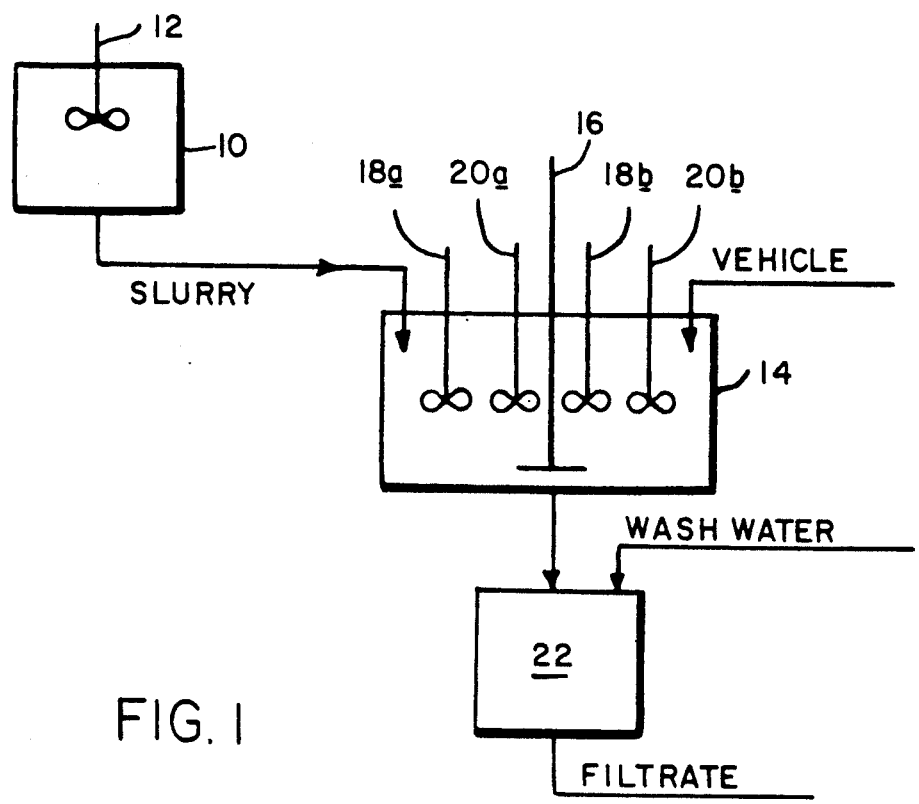
FIG. 1 is a process flow diagram of a system of the invention.

Referring to FIG. 1, an aqueous slurry of an AAA yellow pigment is formed in a strike tank 10 which is provided with a variable speed Post Mixer 12. The aqueous slurry is preferably an aqueous unfiltered slurry containing, by weight, about 5% pigment. The slurry is fed to a mixing tank 14. Five mixing devices are arranged in the mixing tank 14. These include a 4-bladed paddle mixer 16, such as a variable speed Post Mixer, #804293, Varidrive Max 57 RPM located off center, and four high speed mixers 18a, 18b and 20a, 20b. The mixers 18a and 18b preferably comprise Hill Mixers, 50 hp with 45° blades, and the mixers 20a and 20b preferably comprise Hill Mixers, 30 hp with 45° blades. Viewed from above the mixers are located as follows: at 1 o'clock, 18a; 4 o'clock, 20a; 8 o'clock, 18b and 10 o'clock, 20b. After the flushed pigment is formed, the mixture is directed from the tank 14 into a suspended filter bag 22, such as a woven, five ounce, polypropylene sling bag, Stone Container Corp., Opalocka, Florida.

Figure 2:
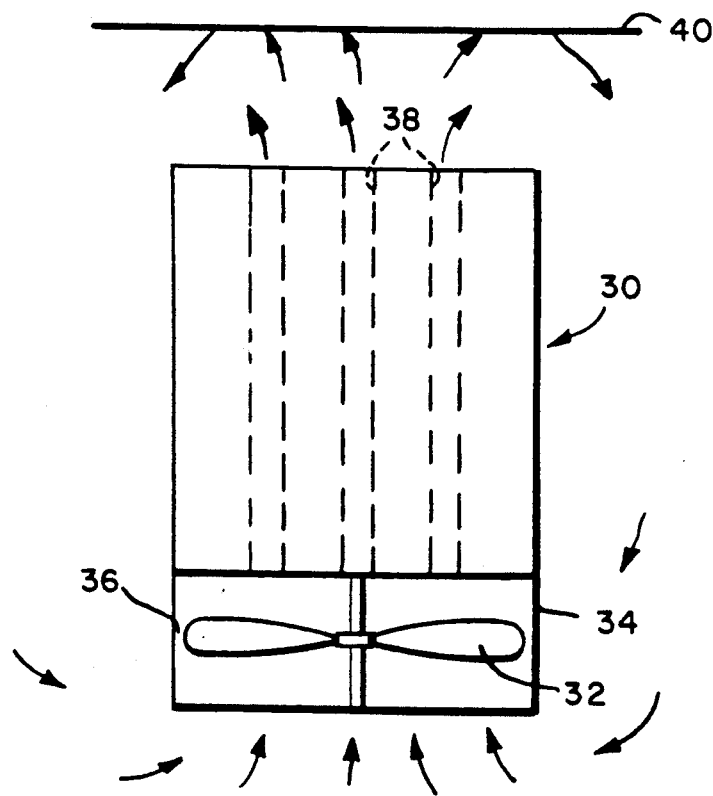
FIG. 2 is a schematic illustration of a submerged mixer, high shear device.

A high shear mixer 30 suitable for purposes of the invention is schematically depicted in FIG. 2. The mixer 30 is adapted to be submerged in tank 14 and comprises blades 32 received in a cylindrical shroud 34. The edges of the blades are spaced apart from the inner surface of the shroud to define a slight gap 36 of from a few mils to 40 mils. High speed rotation of the blades forces the pigment slurry through gap 36, which constitutes a high shear zone, with the result that at least a portion of the pigment is flushed and formed into generally spherical pigment/vehicle conglomerates. These conglomerates are forced upwardly through conduits 38. Upon discharge from the conduits, they impinge upon a baffle 40 and flow outwardly into the tank where they begin growing into clusters.

EXAMPLE I

An AAA pigment yellow coupling process is effected in tank 10 by any conventional process of the type well known in the art. The resulting pigment is an aqueous slurry 5% by weight AAA yellow pigment, and the total weight of the slurry is 29,600 pounds, containing 1480 pounds of dry pigment.

3,330 pounds of soy bean oil is introduced into the 8,000 gallon fiberglass mixing tank 14. The mixer 16 and the mixers 18a and 18b and 20a and 20b are all activated. The mixer 16 is run at 14-15 RPM; the mixers 18a and 18b and 20a and 20b are run at 3540 RPM. The slurry is fed at a rate of about 100 gallons per minute from the tank 10 to the vehicle being agitated in tank 14. The flow of the slurry and vehicle through the mixers 18-20 effects the flushing of the pigment. Water is displaced from the pigment by the vehicle. Pigment/vehicle conglomerates are formed and are dispersed in the water phase where they grow into clusters. The slurry continues to flow to the tank 14 at the same flow rate until the entire 1480 pounds of the pigment in slurry form is mixed with the vehicle.

The entire mixing/flushing process to form the flushed pigment takes approximately two hours; including forty-five minutes to transfer the slurry into the tank 14 and one hour and fifteen minutes for the subsequent mixing in the tank 14. At the conclusion of the mixing/flushing process, the tank 14 contains a two-phase mixture of pigment/vehicle clusters in water. The final pigment/vehicle ratio by weight can range from 4:9 to 1:1.

A sample is then taken and tested to verify completion of the flushing. This test entails formulating a sample from tank 14 into an ink and mixing the ink in a Waring Blender for three (3) minutes. The ink is applied onto an NIPIRI gauge and when it "runs off" the gauge without "scratches" the flushing is complete.

The flushed pigment is then transferred to the filter bag 22 where the water is drained off, leaving a flushed cake of the discrete non-uniform pigment/vehicle having more than about 5% water, say 15% water. The water drains from the cake in about ten (10) minutes. The flushed cake is washed with tap water until all soluble salts are removed. This condition is determined by a reading of 500 microohms or less on a conductivity meter.

The flushed pigment can be dispersed in a news ink vehicle in approximately thirty (30) minutes with a Cowles dissolver. In comparison, a prior art flushed color of the same pigment concentration would take 1 ½ to 2 hours to disperse in the vehicle, followed by one pass through a three roll mill.

Depending upon the requirements of the ink manufacturer, the flushed pigment can be shipped in the nylon mesh bags "as is" or additional water can be removed. If more water is to be removed, the flushed cake is placed in a Banbury or similar mixer. After five to ten minutes some of the entrapped water is separated from the flushed cake. The consistency of the flushed cake turns to a loose paste and the water is decanted from the paste. At this time the percent water in the paste is 5% or less. Whether the flushed pigment is used as aggregate or paste does not affect the dispersibility in inks.

EXAMPLE II

A resinated flushed pigment is formed as described in Example I. After the pigment has been formed in the strike tank, the pH is raised to between 10 to 11.5 and mixing continues for approximately thirty minutes. The slurry is then transferred to the mixing tank for flushing. The mixing/flushing process takes approximately 1 hour. After flushing, the pH is lowered to 6.5-7.0. It is believed raising the pH solvates the resin to allow for a faster rate of flushing and to achieve a higher pigment loading in the final pigment/vehicle composition. The final pigment/vehicle ratio by weight is about 1:1. This flushed pigment can be dispersed in a new ink vehicle in approximately 15 minutes with a Cowles dissolver. Further, the flushed pigment of Example I, when dispersed in the new ink vehicle, experiences thixotropicity within a few minutes. The flushed pigment of this example does not experience any thixotropicity for several minutes.

Historically, phthalocyanine blue, unlike other organic pigments, is manufactured by a salt grinding process which requires heavy duty dough mixers and results in a product called a magma. The magma is then slurried and passed through a filter press where the ethylene glycol and salts are removed. The resulting blue press cake is then flushed. All of this can be avoided by employing the process and equipment described in Example I, with the result being a superior phthalocyanine blue flushed pigmented cake.

EXAMPLE III 1632 pounds of soy bean oil is introduced into the tank 14. 27,400 pounds of an aqueous phthalocyanine blue magma slurry (6% pigment solids) is pumped into the tank 14 at a rate of 100 gallons per minute while all five mixers are activated. After completion of pumping of the pigmented magma slurry into the tank (approximately forty-five (45) minutes) agitation of all mixing equipment is continued for approximately 1 ½ to 2 hours. A sample is taken and evaluated as a finished ink using the test procedure described above to confirm that the flushing is complete.

The mixture from tank 14 is pumped into the nylon mesh bag 22 while washing with tap water to remove the soluble salts and ethylene glycol. The flushed cake contains about 15% water.

In addition to phthalocyanine blue magmas, the process is applicable to other pigments manufactured by the salt grinding process such as quinacridones, dioxazines, perylenes, indanthrones, and vat pigments.

The invention has been described with reference to flushing water from a pigment and replacing the water with vehicle and the recovery of a flushed pigment in the form of discrete generally spherical clusters.

Depending upon the pigment, the vehicle and the processing conditions, the clusters may have indiscriminate sizes and shapes. They may be spherical, non-spherical, rod-like or of any random geometric configuration, uniform or non-uniform.

Figure 3:
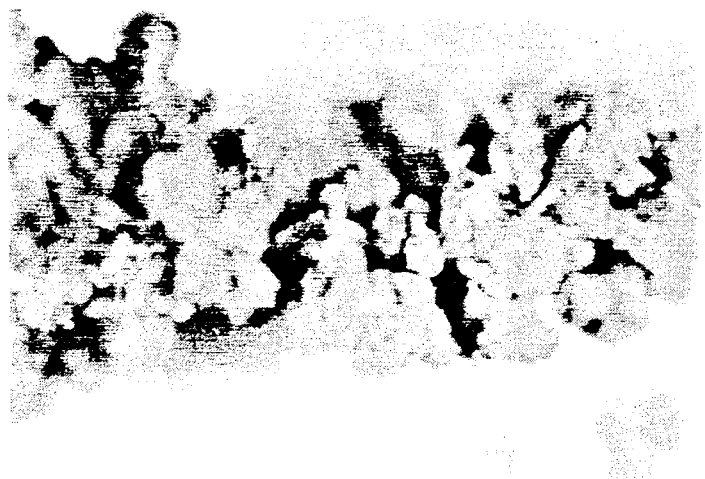
FIG. 3-5 are photomicrographs of flushed pigments made according to the process of the present invention.

FIG. 3 is a photomicrograph of flushed pigment clusters in accordance with the present invention.

Figure 4:
Figure 5:

FIGS. 4 and 5 are photomicrographs of other pigment clusters of the invention more clearly illustrating how the spherical conglomerates tend to agglomerate into various shapes.

Figure 6:
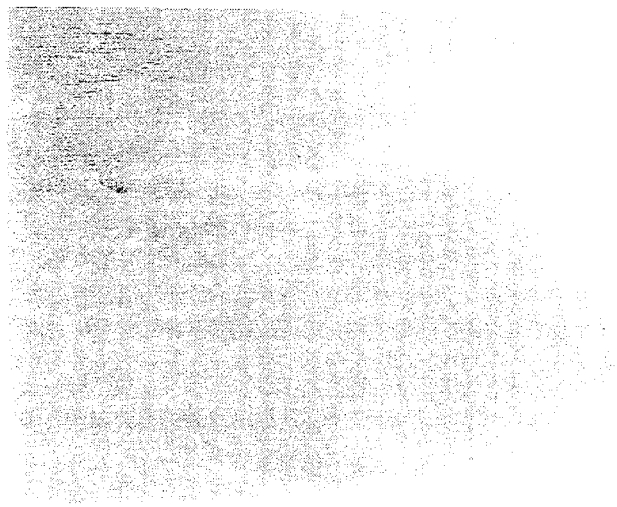
FIG. 6 is a photomicrograph of a prior art 3A yellow flushed color.

FIG. 6 is a photomicrograph of a prior art 3A yellow, specifically, mineral oil flushed color, 28% toner content.

The pigment clusters of FIG. 3 is flushed pigment made according to the process described herein and having a composition of 1:1 pigment to soybean oil in the presence of 20% water. The pigment clusters of FIGS. 4 and 5 are flushed pigments made according to the process disclosed herein and having the composition of 1:1.5 pigment to heat set vehicle (Nevroz SS50).

The size of the clusters, based on their second longest dimension, may range in diameter, $D_p$, from about 0.1 to 10.0 mm. The shape of the clusters measured by sphericity, $\Phi$, may range between 1 to 0.6. For definitions of diameter, $D_p$, and sphericity, $\Phi$, see McCabe, W. L. and Smith, J. C., "Unit Operations of Chemical Engineering", 3rd Ed., pp. 803-804, McGraw Hill Book Company, 1976. The bulk density of the clusters is between 0.5-0.8 gm/cm$^3$.

In the practice of the invention, the flow rates for pigmented slurries and the mixing techniques used will vary depending upon the pigments to be flushed, the medium for the pigment, the percent solids of pigment, the pigment/vehicle ratio desired and the vehicle into which the pigment is to be flushed. Further, the feed to the vehicle may be continuous or intermittent. During flushing, the vehicle will initially exhibit a slight uniform tint which will deepen as the flushing continues. The final appearance of the two phase mixture in the tank should not be streaky or non-uniform. The test for complete flushing is the NIPIRI gauge. The test for growth of the pigment/vehicle conglomerates is also visual. Accordingly, for the above-described reasons, the flow rates and intensity of mixing requirements will vary based on process conditions.

Further, it has been found advantageous to eliminate surface active agents (detergents, wetting agents, emulsifiers) and resinators from the coupling process in the strike tank. These additives are introduced into the strike tank in prior art processes just prior to the final precipitation step to enhance the control of the particle size of the pigments and the dispersibility of the pigments in the press cakes and flushed colors. It has been discovered that these additives are not necessary for purposes of the present invention. That is, it has been found that without such additives, the flushing of the water from the pigment is accomplished more rapidly. However, the invention may be successfully practiced using these additives. It has also been found that the flushing of the pigment can be accomplished more readily when soy bean oil is added to the coupling tank. Specifically, adding vehicle in an amount of about 10% by weight, based on weight of pigment in the coupling tank, reduces the time required to flush in the mixing tank. For Example I, 148 pounds of soy bean oil would be added in the tank 10 to aid in the flushing process previously described. If soy bean oil is used in the coupling tank as a preconditioning agent the vehicle in the mixing tank 14 may be any vehicle previously described including soy bean oil.

The invention may also be used in producing flushed red pigment. The process, as with the yellow pigments, is far less energy and labor intensive than prior art process. Further, the pigments are believed more readily dispersed in vehicle than prior art red pigments.

A further advantage of the invention is that once the pigment has been received in the above-described filter bags, a shrink wrapping can be applied to the bags, thereby enabling them to serve as shipping containers.

The flushed pigment may be used in heat set inks, oil and aromatic printing ink systems.

To determine the suitability of pigment vehicle combinations for a production run, laboratory tests are initially conducted. Listed below are a series of runs which illustrate the applicability of the process and the flushed pigments which are suitable for purposes of the invention.

case, the mixer was actuated and the slurry poured into the agitated vehicle. The Magiesol 47 is a product of Magie Brothers Oil Company and the Nevchem 140 is a product of Neville Chemical Company.

Having described our invention, what we now claim is:

1. A method to produce a flushed pigment which includes:
   mixing a pigmented aqueous slurry and a vehicle;
   displacing the water from the pigment with the vehicle to form pigment/vehicle conglomerates;
   dispersing the conglomerates in an aqueous dispersing phase;
   allowing the pigment/vehicle conglomerates to grow in the dispersing phase to form bead-like pigment/vehicle clusters; and
   recovering the pigment/vehicle clusters from the dispersing phase as flushed pigment.

2. The method of claim 1 wherein the recovery includes:
   filtering the pigment/vehicle clusters from the dispersing media; and
   forming a flushed cake.

3. The method of claim 2 which includes:
   washing the flushed cake.

4. The method of claim 1 wherein the flushed pigment cake contains less water by weight than the pigment content thereof.

5. The method of claim 2 which includes:
   removing water from the flushed cake.

6. The method of claim 5 which includes:
   forming a paste-like mixture having less than 5% water.

7. The method of claim 1 wherein the pigment is selected from the group consisting of CI pigment yellows 12, 13, 14, 17, 83; CI pigment orange 15, 16 and 34; and CI pigment reds 17, 23, 42, 48, 53, and 57.

| Run # | Pigment Used | Dry Weight | % Slurry | Vehicle used out | Water Volume in flushed pigment | Time to complete flushing |
|---|---|---|---|---|---|---|
| 1 | Pigment yellow 12 (AAA) | 400 grams | 4.5%–6.5% | Soybean oil (900 grams) | 5%–35% | 30–40 minutes |
| 2 | Pigment yellow 12 (AAA) | 400 grams | 4.5%–6.5% | Soybean oil (400 grams) | 15%–30% | 45–60 minutes |
| 3 | Pigment yellow 12 (AAA) | 400 grams | 4.5%–6.5% | Soybean oil (400 grams) | 15%–30% | 45–60 minutes |
| 4 | Pigment yellow 12 (AAA) | 400 grams | 4.5%–6.5% | Soybean oil (400 grams) | 15%–30% | 45–60 minutes |
| 5 | Pigment yellow 12 (AAA) | 400 grams | 4.5%–6.5% | Nevchem 140 (360 grams) Magiesol 47 (40 grams) | 25%–50% | 1½–2 hours |
| 6 | Pigment yellow 12 (AAA) | 400 grams | 4.5%–6.5% | Nevchem 140 (320 grams) Magiesol 47 (80 grams) | 25%–50% | 1½–2 hours |
| 7 | Pigment yellow 12 (AAA) | 400 grams | 4.5%–6.5% | Linseed oil (245 grams) | 25%–50% | 1½–2 hours |
| 8 | Pigment yellow 12 (AAA) | 400 grams | 4.5%–6.5% | Whitsol 421 (245 grams) | 25%–50% | 1½–2 hours |
| 9 | Pigment Red 53:1 (Red Lake C) | 400 grams | 5% | Soybean oil (600 grams) | 15%–25% | 1½–2 hours |
| 10 | Pigment Red 57:1 (Lithol Rubine) | 400 grams | 5% | Soybean oil (600 grams) | 15%–25% | 1½–2 hours |
| 11 | Pigment Blue 15:3 (Phthalocyanine blue) | 150 grams | 1.5%–3.0% | Soybean oil (168.75 grams) | 15%–30% | 1½–2 hours |
| 12 | Pigment Blue 15:3 (Phthalocyanine blue) | 150 grams | 1.5%–3.0% | Soybean oil (187.5 grams) | 5%–15% | 1½–2 hours |

The above experiments were conducted using a Gifford-Wood Homo Mixer Model No. IL-69112 and Model No. IL-0957 both at 7500 RPM ½ HP available from Greerco Corp., Hudson, New Hampshire. In each 8. The method of claim 7 wherein the pigment is AAA yellow.

9. The method of claim 1 wherein the pigment is selected from the group consisting of phthalocyanines, quinacridones, dioxazines, perylenes, indanthrones, and vat pigments.

10. The method of claim 9 wherein the pigment is phthalocyanine blue.

11. The method of claim 1 wherein the organic vehicle is selected from the group consisting of drying, semi-drying, and non-drying oils, litho varnishes, mineral oils, rosins, esters of dimerized rosins, aliphatic and aromatic hydrocarbon resins, alkyl-aromatic resins, maleic and fumeric-modified rosin, phenolic resin, phenolic-modified rosin esters, alkyd resins, polyolefins, coumarone resins, phthalate esters, castor oil, fish oil, linseed oil, soy bean oil, gloss varnishes and various heat-set, quick-set and steam-set vehicle systems.

12. The method of claim 11 wherein the organic vehicle is soy bean oil.

13. The method of claim 1 wherein the pigment to vehicle ratio is between 1:7::7:1 by weight.

14. The method of claim 13 wherein the ratio is about 1:1.

15. The method of claim 1 wherein the pigment is formed by a coupling reaction and the thus formed pigment is precipitated in the aqueous slurry which includes:
adding vehicle to the slurry.

16. The method of claim 15 wherein the vehicle is added to the slurry in an amount of between about 5% to 15% by weight based on the total weight of the pigment in the slurry.

17. The method of claim 1 wherein the slurry is less than 10% solids.

18. The method of claim 17 wherein the slurry is between 5% to 7% solids.

19. The method of claim 1 wherein the pigment is a resinated type, and wherein the pH is elevated to between 10 to 11.5 before flushing; and
after flushing is lowered to between 6.5 to 7.0.

20. The method of claim 19 wherein the water content of the flushed pigment is less than the pigment content thereof.

21. The method of claim 19 wherein the pigment is selected from the group consisting of CI pigment yellows 12, 13, 14, 17, 83; CI pigment orange 15, 16 and 34; and CI pigment reds 17, 23, 42, 48 and 57.

22. The method of claim 21 wherein the pigment is AAA yellow.

23. The method of claim 19 wherein the pigment is selected from the group consisting of phthalocyanines, quinacridones, dioxazenes, perylenes, indanthrones and vat pigments.

24. The method of claim 23 wherein the pigment is phthalocyanine blue.

25. The method of claim 19 wherein the vehicle is selected from the group consisting of drying, semi-drying and non-drying oils, litho varnishes, mineral oils, rosins, esters of dimerized rosins, aliphatic and aromatic hydrocarbon resins, alkyl-aromatic resins, maleic and fumeric-modified rosin, phenolic resin, phenolic-modified rosin esters, alkyd resins, polyolefins, coumarone resins, phthalate esters, castor oil, fish oil, linseed oil, soy bean oil, gloss varnishes and various heat-set, quick-set and steam-set vehicle systems.

26. The method of claim 19 wherein the vehicle is soy bean oil.

27. The method of claim 19 wherein the bulk density of the clusters is between 0.5 to 0.8 gm/cm$^3$.

28. The method of claim 19 wherein the diameter, $D_p$, of the clusters is between 0.1 to 1.0 millimeters.

29. The method of claim 1 which includes:
flowing the pigment slurry/vehicle through a high shear zone to effect displacement of the water with the vehicle.

* * * * *